(12) United States Patent
Park

(10) Patent No.: US 7,427,546 B2
(45) Date of Patent: Sep. 23, 2008

(54) TRANSISTOR DEVICE AND METHOD FOR MANUFACTURING THE SAME

(75) Inventor: Jeong-Ho Park, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 4 days.

(21) Appl. No.: 11/615,804

(22) Filed: Dec. 22, 2006

(65) Prior Publication Data

US 2007/0152284 A1    Jul. 5, 2007

(30) Foreign Application Priority Data

Dec. 29, 2005    (KR) .................. 10-2005-0133428

(51) Int. Cl.
*H01L 29/76* (2006.01)
(52) U.S. Cl. .................. 438/259; 438/300; 438/586; 438/257; 438/291; 257/330; 257/192; 257/413; 257/396; 257/E29.156

(58) Field of Classification Search .................. 438/259, 438/300, 586, 257, 291; 257/330, 192, 413, 257/396, E29.176
See application file for complete search history.

(56) References Cited

U.S. PATENT DOCUMENTS 6,303,448 B1 * 10/2001 Chang et al. .................. 438/300
6,780,732 B2 * 8/2004 Durcan et al. .................. 438/430

FOREIGN PATENT DOCUMENTS

| KR | 1020000017149 A | 3/2000 |
|---|---|---|
| KR | 2001-0080432 | 8/2001 |

* cited by examiner

*Primary Examiner*—Minh-Loan Tran
*Assistant Examiner*—Selim Ahmed
(74) *Attorney, Agent, or Firm*—Sherr & Nourse, PLLC

(57) ABSTRACT

A transistor device includes a recess in a surface of semiconductor substrate, a gate insulation layer formed over an inner side of the recess, a gate conductor filling the recess in which the gate insulation layer is formed, and source and drain regions located over the substrate adjacent the recess. Among the advantages: the gate structure lowers overall gate resistance and reduces the short channel effect.

8 Claims, 3 Drawing Sheets

TRANSISTOR DEVICE AND METHOD FOR MANUFACTURING THE SAME

The present application claims priority under 35 U.S.C. 119 and 35 U.S.C. 365 to Korean Patent Application No. 10-2005-0133428 (filed on Dec. 29, 2005), which is hereby incorporated by reference in its entirety.

BACKGROUND

When a transistor of a semiconductor device is formed, a structure of a gate may soar relatively high over a silicon substrate. This may create problems in defining the length of the gate when the devices are scaled down. Also, when lightly doped drain ion implants and source and drain ion implants are formed, masking steps are required. Thus the cost for fabricating the devices is increased.

Therefore, there has been a need to create a transistor device having a new gate structure.

SUMMARY

Embodiments relate to semiconductor device, and more particularly, to a method for fabricating a transistor that may overcome a short channel effect (SCE).

Accordingly, embodiments are directed to a transistor device and a method for manufacturing the same that substantially obviates one or more problems due to limitations and disadvantages of the related art.

Embodiments relate to a transistor device and a method for manufacturing the same, which effectively may reduce size of a semiconductor device.

Additional advantages, objects, and features of the embodiments will be set forth in part in the description which follows and in part will become apparent to those having ordinary skill in the art upon examination of the following or may be learned from practice of the embodiments. The objectives and other advantages of the embodiments may be realized and attained by the structure particularly pointed out in the written description and claims hereof as well as the appended drawings.

Embodiments relate to a method for fabricating a transistor by forming a first insulation layer and a second insulation layer over a semiconductor substrate; selectively etching the first and second insulation layers and semiconductor substrate to form a recess; depositing a gate insulation layer and a gate conductor layer; planarizing the gate insulation layer and the gate conductor layer to form a gate structure filling the recess; removing the second insulation layer; forming a spacer over a side wall of the gate; implanting ions into the semiconductor substrate near the spacer to form source and drain regions; wet etching the second insulation layer and the gate insulation layer to expose an upper side wall of the gate and upper portions of the source and drain regions; and forming a salicide layer on the exposed surface of the gate and over the source and drain regions.

The planarizing may be carried out by chemical mechanical polishing (CMP) of the gate conductor using the second insulation layer as a polishing stop layer.

The LDD and the source and drain ion implantation profile may be formed by ion implantation using a mask once in the source and drain regions. The gate conductor may include polysilicon, and the gate insulation layer may include nitride-based oxide, hafnium-based oxide, tantalum-based oxide, or titanium-based oxide.

The recess may be etched to a depth of 500 Å to 2000 Å.

The wet etching of the second insulation layer leaves a portion of the second insulation layer which is over the source and drain regions, adjacent the gate insulation layer and below the spacer. The spacer entirely covers and extends beyond the top surface of the second insulation layer.

Embodiments relate to a transistor device including a recess in a surface of semiconductor substrate; a gate insulation layer formed over an inner side of the recess; a gate conductor filling the recess in which the gate insulation layer is formed; and source and drain regions located over the substrate adjacent the recess. An upper portion of the gate conductor projects above the surface of the semiconductor substrate. A spacer may be formed over the side wall of a gate insulation portion that is projected above the surface of semiconductor substrate. A salicide layer may be formed over a upper portion of the gate and over the source and drain regions.

Embodiments relate to a transistor device and a method for manufacturing the same, which effectively may reduce size of a semiconductor device.

It is to be understood that both the foregoing general description and the following detailed description of the embodiments are exemplary and explanatory and are intended to provide further explanation of the claimed subject matter.

DETAILED DESCRIPTION

Figure 1:
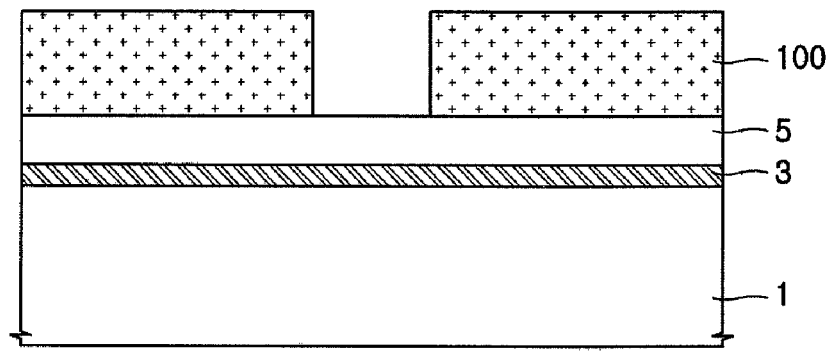
FIGS. 1 through 7 are sectional views illustrating a transistor device and a method for fabricating the same according to embodiments.

With reference to FIG. 1, a first insulation layer 3 and a second insulation layer 5 are deposited over a semiconductor substrate 1. A first photoresist mask layer 100 is formed over the insulating layers for etching the first insulation layer 3 and the second insulation layer 5. First insulation layer 3 may be composed of silicon oxide while the second insulation layer 5 may be composed of silicon nitride.

Figure 2:
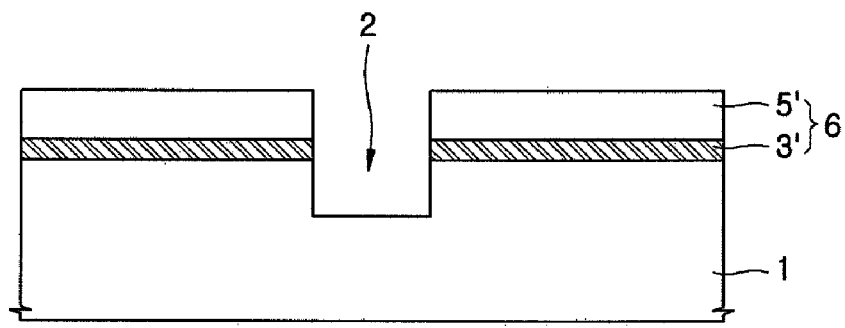

In FIG. 2, the first and the second insulation layer 3 and 5 are selectively etched using mask 100 to create patterns 3' and 5', which collectively constitute etching mask 6. A dry etching process using mask 6 forms recess 2 in the semiconductor substrate 1. The recess 2 may be etched to a depth of approximately 500 Å to 2000 Å.

Figure 3:
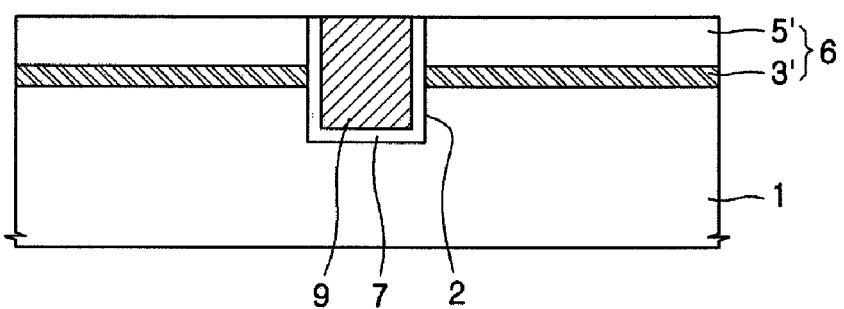

In FIG. 3, a gate insulation layer 7 and a gate conductor layer are deposited. A gate 9 and the gate insulation layer 7 are planarized using a chemical mechanical polishing (CMP) method using the pattern of the second insulation layer 5' as a stop layer. Therefore, gate 9, which fills recess 2, is approximately 500 Å to 2000 Å thick. The gate 9 may include polysilicon and the gate insulation layer may include a nitride-based oxide, hafnium-based oxide, tantalum-based oxide, or titanium-based oxide.

Figure 4:
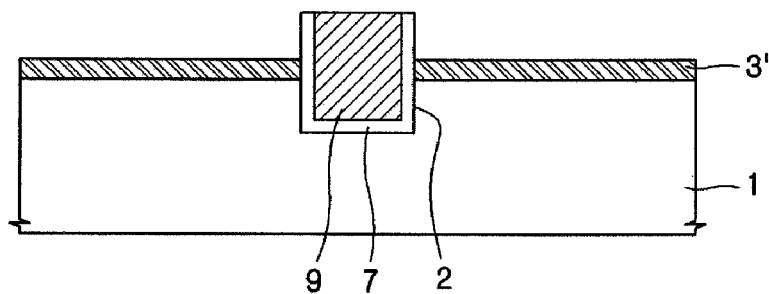

In FIG. 4, the pattern of the insulation layer 5' has been completely removed using, for example, a wet etching method using phosphoric acid solution.

Figure 5:
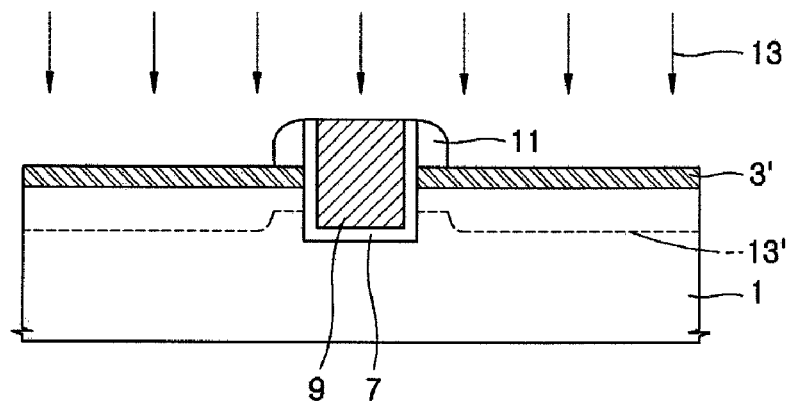

With reference to FIG. 5, after depositing a layer for the spacer 11 over the side wall of the gate 7, spacer 11 is formed by using for example, a front etching method. The spacer 11 may also be formed by an isotropic etching method. And then LDD and high density source and drain regions 13' are formed by implanting ions. The ion implantation process is performed once at the LDD and source and drain regions 13' to form a profile of the LDD and source/drain regions 13'. The ion implant profile after annealing is shown.

Figure 6:
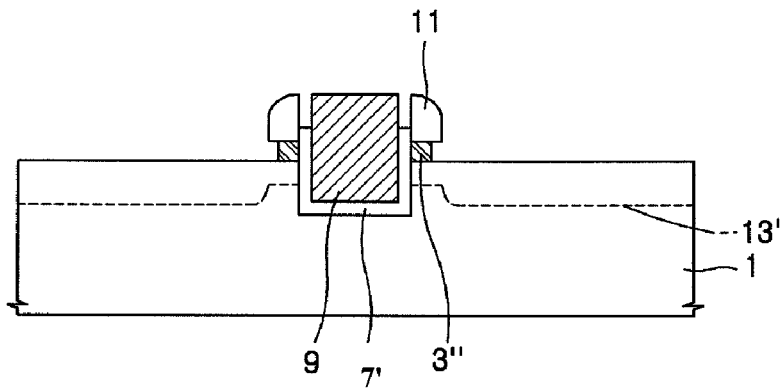

In FIG. 6, a gate insulation layer 7' and a second pattern 3" of the first insulation layer are formed by wet etching. The second pattern 3" of the first insulation layer forms a recessed filler over the gate insulation layer 7' between the spacer 11 and LDD region. Gate insulation 7' is recessed from the top plane of the gate and spacers 11, to expose an upper side wall of the gate 9.

Figure 7:
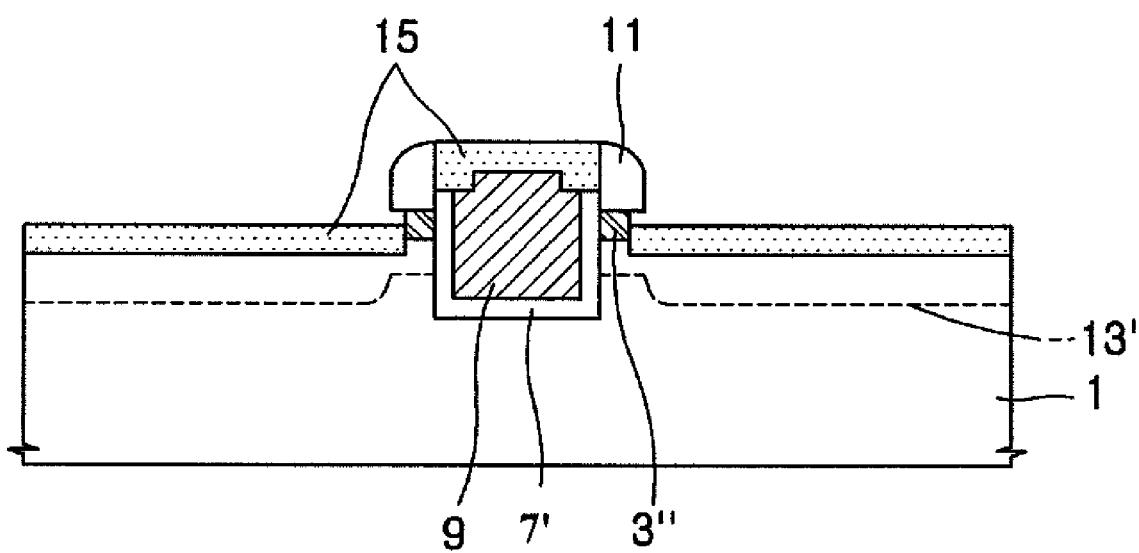

In FIG. 7, a salicide process is performed on gate 9, and source and drain regions 13 to form salicide layer 15. The salicide layer 15 is formed by heat treatment between 700 to 1000° C., after depositing one of, for example, cobalt, nickel, and Ti over the whole surface.

As described, embodiments relate to a method for fabricating a semiconductor transistor. A new scheme, facilitating a scaling down of the size of the transistors, is proposed. The gate resistance may be reduced without increasing the area used on the surface of the substrate. Lateral diffusion of the ion implant source may be more easily controlled to reduce the short channel effect. It is therefore possible to implement a shallow well ion implantation process at a smaller device scale, with smaller transistor features.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method for fabricating a transistor comprising:
   forming a first insulation layer and a second insulation layer over a semiconductor substrate;
   selectively etching the first and second insulation layers and semiconductor substrate to form a recess;
   depositing a gate insulation layer and a gate conductor layer;
   planarizing the gate insulation layer and the gate conductor layer to form a gate structure filling the recess;
   removing the second insulation layer;
   forming a spacer over a side wall of the gate;
   implanting ions into the semiconductor substrate near the spacer to form source and drain regions;
   wet etching the first insulation layer and the gate insulation layer to expose an upper side wall of the gate and upper portions of the source and drain regions; and
   forming a salicide layer on the exposed surface of the gate and over the source and drain regions.

2. A method according to claim 1, wherein the planarizing comprises chemical mechanical polishing (CMP) of the gate conductor using the second insulation layer as a polishing stop layer.

3. A method according to claim 1, wherein the LDD and the source and drain ion implantation profile is formed by ion implantation using a mask once in the source and drain regions.

4. A method according to claim 1, wherein the gate conductor includes polysilicon.

5. A method according to claim 1, wherein the gate insulation layer includes one selected from the group consisting of nitride-based oxide, hafnium-based oxide, tantalum-based oxide, and titanium-based oxide.

6. A method according to claim 1, wherein the recess is etched to a depth of 500 Å to 2000 Å.

7. A method according to claim 1, wherein said wet etching the first insulation layer leaves a portion of the first insulation layer which is over the source and drain regions, adjacent the gate insulation layer and below the spacer.

8. A method according to claim 7, wherein said the spacer entirely covers and extends beyond a top surface of said portion of the second insulation layer.

* * * * *